(12) United States Patent
Nakayama (10) Patent No.: US 11,495,977 B2
(45) Date of Patent: Nov. 8, 2022

(54) MANAGEMENT DEVICE AND POWER STORAGE SYSTEM CAPABLE OF CORRECTING MEASURED VOLTAGES OF MULTIPLE CELLS CONNECTED IN SERIES

(71) Applicant: SANYO Electric Co., Ltd., Osaka (JP)

(72) Inventor: Masato Nakayama, Hyogo (JP)

(73) Assignee: SANYO Electric Co., Ltd., Osaka (JP)

( * ) Notice: Subject to any disclaimer, the term of this patent is extended or adjusted under 35 U.S.C. 154(b) by 77 days.

(21) Appl. No.: 17/053,395

(22) PCT Filed: Apr. 5, 2019

(86) PCT No.: PCT/JP2019/015095
§ 371 (c)(1),
(2) Date: Nov. 6, 2020

(87) PCT Pub. No.: WO2019/220805
PCT Pub. Date: Nov. 21, 2019

(65) Prior Publication Data
US 2021/0234379 A1 Jul. 29, 2021

(30) Foreign Application Priority Data
May 14, 2018 (JP) .............................. JP2018-093227

(51) Int. Cl.
*H02J 7/00* (2006.01)
*G01R 31/392* (2019.01)
(Continued)

(52) U.S. Cl.
CPC .......... *H02J 7/0016* (2013.01); *B60L 3/0046* (2013.01); *G01R 31/3828* (2019.01);
(Continued)

(58) Field of Classification Search
CPC .... H02J 7/0016; H02J 7/0047; G01R 31/392; G01R 31/396; G01R 31/3828;
(Continued)

(56) References Cited

U.S. PATENT DOCUMENTS

2013/0057219 A1* 3/2013 Sakata .................... B60L 53/24
320/118
2017/0229883 A1* 8/2017 Sugiyama ........... H01M 10/443

FOREIGN PATENT DOCUMENTS

JP 2013-055825 3/2013

OTHER PUBLICATIONS

International Search Report of PCT application No. PCT/JP2019/015095 dated Jun. 25, 2019.
(Continued)

*Primary Examiner* — Nathaniel R Pelton
(74) *Attorney, Agent, or Firm* — WHDA, LLP (57) ABSTRACT

In order to detect a cell voltage with high accuracy during an equalizing process among a plurality of cells, during execution of the equalizing process among the plurality of cells, controller measures a value of a current flowing to a negative electrode of an nth cell through an nth discharge resistor, calculates an (n−1)th voltage drop value due to a wiring resistance value of an (n−1)th wiring and an nth voltage drop value due to a wiring resistance value of an nth wiring based on the measured current value, and the wiring resistance value of the (n−1)th wiring connected to a positive electrode of the nth cell and a wiring resistance value of the nth wiring connected to the negative electrode of the nth cell, the wiring resistance value of the (n−1)th wiring and the wiring resistance value of the nth wiring being measured in advance, and, based on the (n−1)th voltage drop value and the nth voltage drop value, corrects the voltage value of the nth cell,
(Continued)

a voltage value of an (n−1)th cell, and a voltage value of an (n+1)th cell measured by voltage measurement circuit.

4 Claims, 7 Drawing Sheets

(51) Int. Cl.
    *G01R 31/396*     (2019.01)
    *G01R 31/3828*     (2019.01)
    *B60L 3/00*     (2019.01)
    *H01M 10/0525*     (2010.01)
    *H01M 10/42*     (2006.01)
    *H01M 10/48*     (2006.01)

(52) U.S. Cl.
    CPC ......... *G01R 31/392* (2019.01); *G01R 31/396* (2019.01); *H01M 10/0525* (2013.01); *H01M 10/425* (2013.01); *H01M 10/482* (2013.01); *H02J 7/0047* (2013.01); *H01M 2010/4271* (2013.01); *H01M 2220/20* (2013.01)

(58) Field of Classification Search
    CPC ........... H01M 10/0525; H01M 10/425; H01M 10/482; H01M 2010/4271; H01M 2220/20
    USPC ........................................................ 320/109
    See application file for complete search history.

(56) References Cited

OTHER PUBLICATIONS

The Extended European Search Report dated Apr. 28, 2021, issued in counterpart EP Application No. 19803965.3. (6 pages).

\* cited by examiner

MANAGEMENT DEVICE AND POWER STORAGE SYSTEM CAPABLE OF CORRECTING MEASURED VOLTAGES OF MULTIPLE CELLS CONNECTED IN SERIES

CROSS-REFERENCE TO RELATED APPLICATIONS

This application is a U.S. national stage application of the PCT International Application No. PCT/JP2019/015095 filed on Apr. 5, 2019, which claims the benefit of foreign priority of Japanese patent application No. 2018-093227 filed on May 14, 2018, the contents all of which are incorporated herein by reference.

TECHNICAL FIELD

The present invention relates to a management device and a power storage system that manage states of a plurality of cells connected in series.

BACKGROUND ART

In recent years, hybrid vehicles (HV), plug-in hybrid vehicles (PHV), and electric vehicles (EV) have become popular. Secondary batteries are mounted as key devices in these vehicles. Lithium-ion batteries have become the mainstream as secondary batteries for vehicles.

Usually, in a lithium ion battery, from the viewpoint of ensuring safety, each voltage of a plurality of cells connected in series is constantly monitored by a voltage measurement circuit. Each input terminal of the voltage measurement circuit and each node (including both ends) of a plurality of cells are connected by wiring, and the voltage measurement circuit measures the voltage between two adjacent wirings to measure the voltage of each cell. The voltage of each cell measured by the voltage measurement circuit is transmitted to a microcomputer and variously used for control, and it is monitored whether or not the voltage of each cell is within a normal range.

In the lithium-ion battery, in order to utilize the ability of the battery to a maximum extent, an equalizing process for equalizing the capacities between a plurality of cells connected in series is executed. A passive balance method is the mainstream for the equalizing process among the plurality of cells. In the passive balance method, among a plurality of cells connected in series, the cells other than the cell having the smallest capacity are discharged such that the capacities of the other cells match the capacity of the cell having the smallest capacity.

A discharge circuit for equalization is generally configured to be connected between two adjacent wirings in the plurality of wirings for voltage measurement (for example, see PTL 1). In this configuration, the voltage of the cell during equalizing discharge appears to be reduced by an amount of voltage drop due to a wiring resistance from the voltage measurement circuit. The voltage drop due to the wiring resistance becomes larger as the wiring (mainly the wire harness) is longer and/or an equalization current is larger.

On the other hand, it is conceivable to detect a correction voltage of each cell based on a difference voltage of a cell voltage between a state in which a switch of the discharge circuit is turned off and a state in which the switch is turned on, add the correction voltage to the cell voltage measured during equalizing discharge, and correct the cell voltage measured during the equalizing process (see, for example, PTL 1).

CITATION LIST

Patent Literature

PTL 1: Unexamined Japanese Patent Publication No. 2013-55825

SUMMARY OF THE INVENTION

In the equalizing process, discharge ends from the cell whose capacity reaches a target value among the plurality of cells connected in series. That is, the ON/OFF states of the switches of the plurality of discharge circuits are switched randomly in the middle of the equalizing process. During the equalizing process, the voltages of the plurality of cells may vary due to a variation of a load connected to a power storage module including the plurality of cells connected in series. If the cell voltage rises, a voltage drop amount due to a wiring resistance also increases, and if the cell voltage drops, the voltage drop amount due to the wiring resistance also decreases. In the conventional method of correcting the cell voltage measured during the equalizing process, these variation factors have not been sufficiently taken into consideration.

The present invention has been made in view of such circumstances, and an object thereof is to provide a technique of detecting a cell voltage with high accuracy during an equalizing process among a plurality of cells.

In order to solve the above problems, a management device according to an aspect of the present invention includes a voltage measurement circuit that is connected to m (m is an integer of more than or equal to 2) cells, connected in series, by (m+1) wirings and measures each voltage of the m cells, m discharge circuits that are each connected between two adjacent wirings of the (m+1) wirings and each include a discharge resistor and a switch connected in series, and a controller that executes an equalizing process among the m cells by controlling each of the switches of the m discharge circuits based on the voltages of the m cells measured by the voltage measurement unit. During execution of the equalizing process among the plurality of cells, the controller measures a current value, flowing from a positive electrode of an nth cell to a negative electrode of the nth cell through an nth discharge resistor, based on a resistance value of the nth discharge resistor connected to an nth ($1 \leq n \leq m$) switch in an ON state and a voltage value of the nth cell measured by the voltage measurement circuit, calculates an (n−1)th voltage drop value due to a wiring resistance value of an (n−1)th wiring and an nth voltage drop value due to a wiring resistance value of an nth wiring based on the measured current value and the wiring resistance value of the (n−1)th wiring connected to the positive electrode of the nth cell and a wiring resistance value of the nth wiring connected to the negative electrode of the nth cell, the wiring resistance value of the (n−1)th wiring and the wiring resistance value of the nth wiring being measured in advance, and based on the (n−1)th voltage drop value and the nth voltage drop value, corrects the voltage value of the nth cell, a voltage value of an (n−1)th cell, and a voltage value of an (n+1)th cell measured by the voltage measurement circuit.

According to the present invention, the cell voltage among the plurality of cells during the equalizing process can be detected with high accuracy.

DESCRIPTION OF EMBODIMENT

Figure 1:
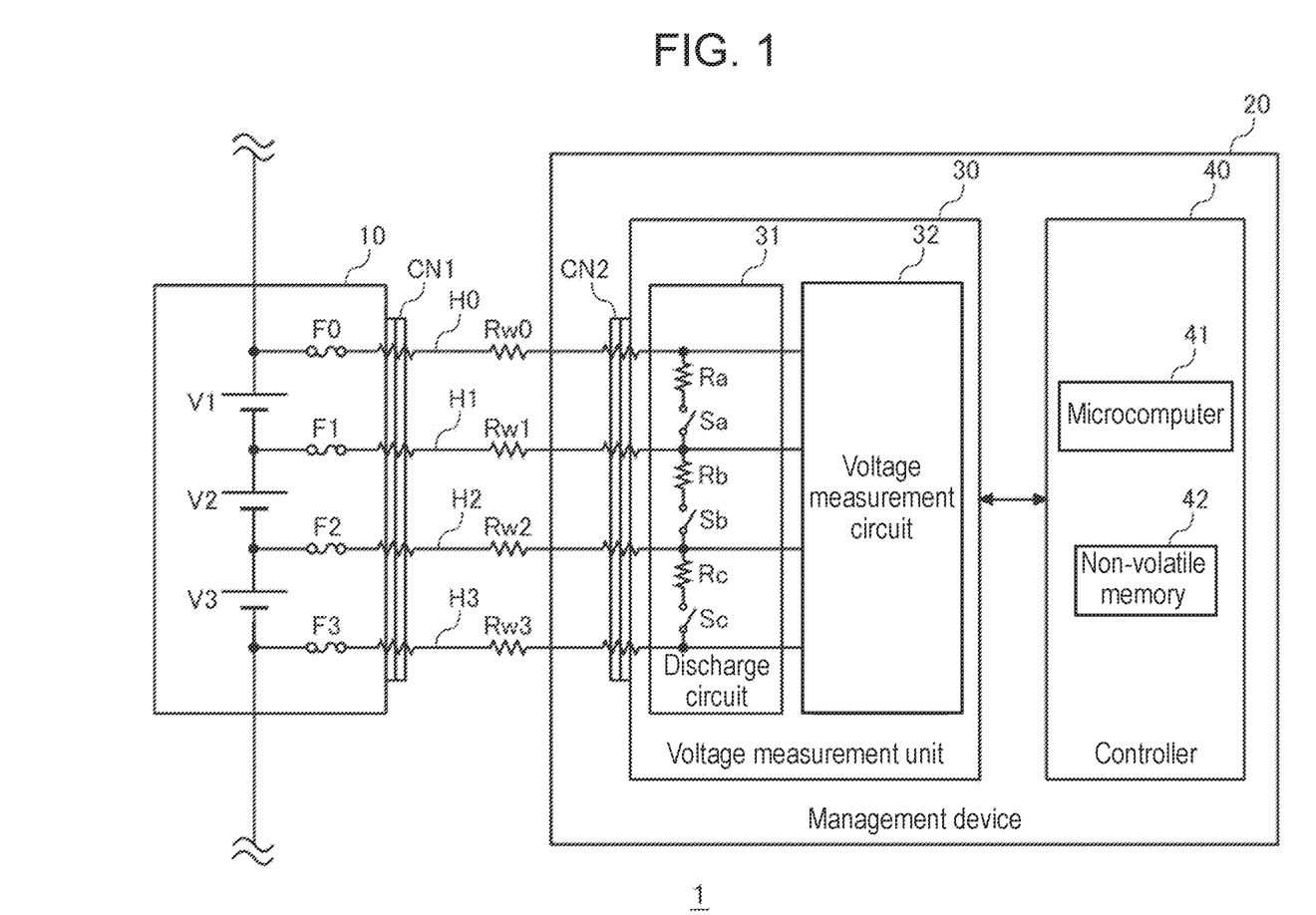
FIG. 1 is a diagram for explaining a power storage system according to an exemplary embodiment of the present invention.

FIG. 1 is a diagram for explaining power storage system 1 according to an exemplary embodiment of the present invention. Power storage system 1 is mounted on a vehicle and used as a battery for driving a vehicle. Power storage system 1 includes power storage module 10 and management device 20. Power storage module 10 includes a plurality of cells V1 to V3 connected in series. As the cell, a lithium-ion battery cell, a nickel hydrogen battery cell, a lead battery cell, an electric double layer capacitor cell, a lithium-ion capacitor cell, or the like can be used. Hereinafter, in the present specification, an example using a lithium-ion battery cell (nominal voltage: 3.6 V to 3.7 V) is assumed.

For simplicity, FIG. 1 depicts power storage module 10 in which three cells V1 to V3 are connected in series. However, in the actual configuration, more cells are connected in series in accordance with a voltage specification required for power storage system 1. A plurality of cells may be connected in series and parallel to increase the capacity.

Power storage module 10 includes first connector CN1 for connecting a plurality of wire harnesses H0 to H3. A plurality of internal-side terminals of first connector CN1 and a plurality of nodes of the plurality of cells V1 to V3 connected in series are respectively connected by a plurality of internal wirings. The nodes of the plurality of cells V1 to V3 are set between both ends of the plurality of cells V1 to V3 and two adjacent cells. Therefore, a number of nodes of the plurality of cells is (m+1), where m is a number of cells (m is an integer of more than or equal to 2). Similarly, a number of internal wirings in power storage module 10 and a number of wire harnesses are (m+1). In the example shown in FIG. 1, since the number of cells is 3, the number of nodes, the number of internal wirings, and the number of wire harnesses are each 4.

Fuses F0 to F4 are respectively inserted into the plurality of internal wirings in power storage module 10. Fuses F0 to F4 are blown when a current more than or equal to a rated value flows through the fuses and protect the cells and the wire harnesses from overcurrent. The insertion of fuses F0 to F4 is not essential and can be omitted.

Management device 20 includes voltage measurement unit 30 and controller 40. Voltage measurement unit 30 includes discharge circuit 31 and voltage measurement circuit 32. Discharge circuit 31 and voltage measurement circuit 32 are installed on the same substrate.

Voltage measurement unit 30 includes second connector CN2 for connecting the plurality of wire harnesses H0 to H3. The plurality of wire harnesses H0 to H3 are respectively connected between a plurality of external-side terminals of first connector CN1 of power storage module 10 and the plurality of external-side terminals of second connector CN2 of voltage measurement unit 30. The plurality of internal-side terminals of second connector CN2 and a plurality of analog input terminals of voltage measurement circuit 32 are respectively connected by a plurality of internal wirings. A number of the internal wirings is also (m+1).

Voltage measurement circuit 32 measures each voltage of the plurality of cells V1 to V3 by measuring the voltage between two adjacent wirings among the plurality of internal wirings. Voltage measurement circuit 32 includes, for example, a multiplexer and an A/D converter. The multiplexer outputs the voltage between two adjacent wirings to the A/D converter in order from the top. The A/D converter converts an analog voltage input from the multiplexer into a digital value.

Voltage measurement circuit 32 transmits the measured voltages of the plurality of cells V1 to V3 to controller 40. Normally, since a ground potential of a substrate on which voltage measurement unit 30 is installed and a ground potential of a substrate on which controller 40 is installed are different (the former voltage is higher), information is transmitted by isolated communication between voltage measurement unit 30 and controller 40.

Discharge circuit 31 includes discharge resistors Ra to Rc and discharge switches Sa to Sc that are connected in series between two adjacent wirings of the plurality of internal wirings in voltage measurement unit 30. Discharge switches Sa to Sc are constituted of, for example, a semiconductor switch such as a metal-oxide-semiconductor field-effect transistor (MOSFET). When first discharge switch Sa is turned on, both ends of first cell V1 connected in parallel with first discharge switch Sa and first discharge resistor Ra become conductive, and first cell V1 is discharged. Other cells are similarly discharged when the discharge switches connected in parallel are turned on.

Controller 40 manages power storage module 10 based on the voltages, currents, and temperatures of the plurality of cells V1 to V3 that are measured by voltage measurement unit 30, a current measurement unit (not shown), and a cell temperature measurement unit (not shown). Controller 40 can be constituted of microcomputer 41 and nonvolatile memory 42 (such as an electrically erasable programmable read-only memory (EEPROM) or flash memory).

Controller 40 estimates SOC (State Of Charge) and SOH (State Of Health) of the plurality of cells V1 to V3 based on the voltages, currents, and temperatures of the plurality of cells V1 to V3. The SOC can be estimated by, for example, an OCV (Open Circuit Voltage) method or a current integration method. The OCV method is a method of estimating the SOC based on the OCV of the cell measured by voltage measurement circuit 32 and characteristic data of an SOC- OCV curve held in advance. The current integration method is a method of estimating the SOC based on the OCV measured by voltage measurement circuit 32 at the start of charge/discharge of the cell and an integrated value of the measured current.

The SOH is defined as a ratio of a current full-charge capacity to an initial full-charge capacity, and shows that the lower the value (the closer to 0%), the more degradation progresses. Degradation of the secondary battery can be approximated by a sum of storage degradation and cycle degradation.

The storage degradation is degradation that progresses over time depending on the temperature of the secondary battery at each time point and the SOC at each time point, regardless of whether or not the secondary battery is being charged or discharged. The higher the SOC at each time point (the closer to 100%) or the higher the temperature at each time point, the higher a storage degradation rate.

The cycle degradation is degradation that progresses as a number of times of charge and discharge increases. The cycle degradation depends on an SOC range used, a temperature, and a current rate. The wider the SOC range used, the higher the temperature, or the higher the current rate, the higher the cycle degradation rate. As described above, the degradation of the secondary battery greatly depends on the usage environment, and a variation in the capacity among the plurality of cells V1 to V3 becomes larger as the usage period becomes longer.

Controller 40 executes an equalizing process among the plurality of cells V1 to V3 based on the voltages of the plurality of cells V1 to V3 received from voltage measurement unit 30. In a general passive cell balance method, other cells than the cell having the smallest capacity of the plurality of cells V1 to V3 are discharged to the capacity of the cell having the smallest capacity (hereinafter, referred to as a target value). The target value may be specified by any of the actual capacity, the SOC, and the OCV. When the target value is specified by the OCV, the OCV of the cell with the lowest OCV becomes the target value. The target value may be specified by a dischargeable amount or a chargeable amount.

Controller 40 sets a measured value of the cell having the smallest capacity of the plurality of cells V1 to V3 as the target value, and calculates differences between the target value and measured values of the other plurality of cells. Controller 40 calculates discharge amounts of the other plurality of cells based on the calculated respective differences, and calculates discharge times of the other plurality of cells based on the calculated respective discharge amounts. Controller 40 generates a control signal for the equalizing process that includes the discharge times of the plurality of cells and transmits the control signal to voltage measurement unit 30. A switch control circuit (not shown) in voltage measurement unit 30 controls each of the plurality of discharge switches Sa to Sc to be in the ON state for a designated time based on the control signal received from controller 40.

In the above circuit configuration, during a cell balancing operation by discharge circuit 31, the cell voltage measured by voltage measurement circuit 32 decreases or increases with respect to the actual voltage due to an influence of a wiring resistance. For example, during equalizing discharge of second cell V2, the current flows from a positive electrode of second cell V2 to a negative electrode of second cell V2 through first wire harness H1, second discharge resistor Rb, second discharge switch Sb, and second wire harness H2. In this current loop, in addition to a resistance component in voltage measurement unit 30, there are resistance components based on a wiring resistance of a first internal wiring in power storage module 10, a resistance of first fuse F1, a contact resistance of first connector CN1, wiring resistance Rw1 of first wire harness H1, a contact resistance (×2) of second connector CN2, wiring resistance Rw2 of second wire harness H2, a contact resistance of first connector CN1, a wiring resistance of a second internal wiring in power storage module 10, and a resistance of second fuse F2.

Hereinafter, a wiring resistance of a 0th internal wiring in power storage module 10, a resistance of 0th fuse F0, the contact resistance of first connector CN1, wiring resistance Rw0 of 0th wire harness H0, and the contact resistance of second connector CN2 are collectively referred to as 0th wiring resistance R0. Wiring resistance Rw0 of 0th wire harness H0 has the largest value among these resistances.

Similarly, the wiring resistance of the first internal wiring in power storage module 10, the resistance of first fuse F1, the contact resistance of first connector CN1, wiring resistance Rw1 of first wire harness H1, and the contact resistance of second connector CN2 are collectively referred to as first wiring resistance R1. The same applies to second wiring resistance R2 and third wiring resistance R3.

For example, by equalizing discharge of second cell V2, equalizing current Ib flows in a wiring path (hereinafter referred to as the first external wiring) from the positive electrode of second cell V2 to a first input terminal of voltage measurement unit 30, and equalizing current Ib flows in a wiring path (hereinafter referred to as the second external wiring) from a second input terminal of voltage measurement unit 30 to the negative electrode of second cell V2. It is assumed that first cell V1 and third cell V3 are not subjected to equalizing discharge. That is, it is assumed that no current flows in a 0th external wiring and a third external wiring.

A voltage drop of Vf1=(R1×Ib) occurs in the first external wiring. In addition, a voltage drop of Vf2=(R2×Ib) occurs in the second external wiring. As a result, a potential of a first input terminal of voltage measurement circuit 32 decreases by Vf1, and a potential of a second input terminal of voltage measurement circuit 32 increases by Vf2. As a result, a cell voltage of second cell V2 measured by voltage measurement circuit 32 is measured lower than the actual voltage by Vf1+Vf2. The cell voltage of first cell V1 adjacent to second cell V2 is measured higher than the actual voltage by Vf1. The cell voltage of third cell V3 adjacent to second cell V2 is measured higher than the actual voltage by Vf2.

When the cell balancing operation by discharge circuit 31 is not in progress, almost no current flows through the 0th external wiring to the third external wiring, and the cell voltage measured by voltage measurement circuit 32 and the actual voltage substantially match. On the other hand, during the cell balancing operation by discharge circuit 31, the longer a wire length of 0th wire harness H0 to third wire harness H3, and/or the larger an equalization current, the larger a difference between the cell voltage measured by voltage measurement circuit 32 and the actual voltage.

On the other hand, in the present exemplary embodiment, controller 40 measures a wiring resistance value of each external wiring in advance and holds the value. Controller 40 measures the current flowing through each external wiring during the cell balancing operation, and calculates a voltage drop amount due to the wiring resistance of each external wiring based on the measured current value and the wiring resistance value held. Controller 40 corrects the voltage measured by voltage measurement circuit 32 based on the calculated voltage drop amount. A detailed description will be given below.

Figure 2:
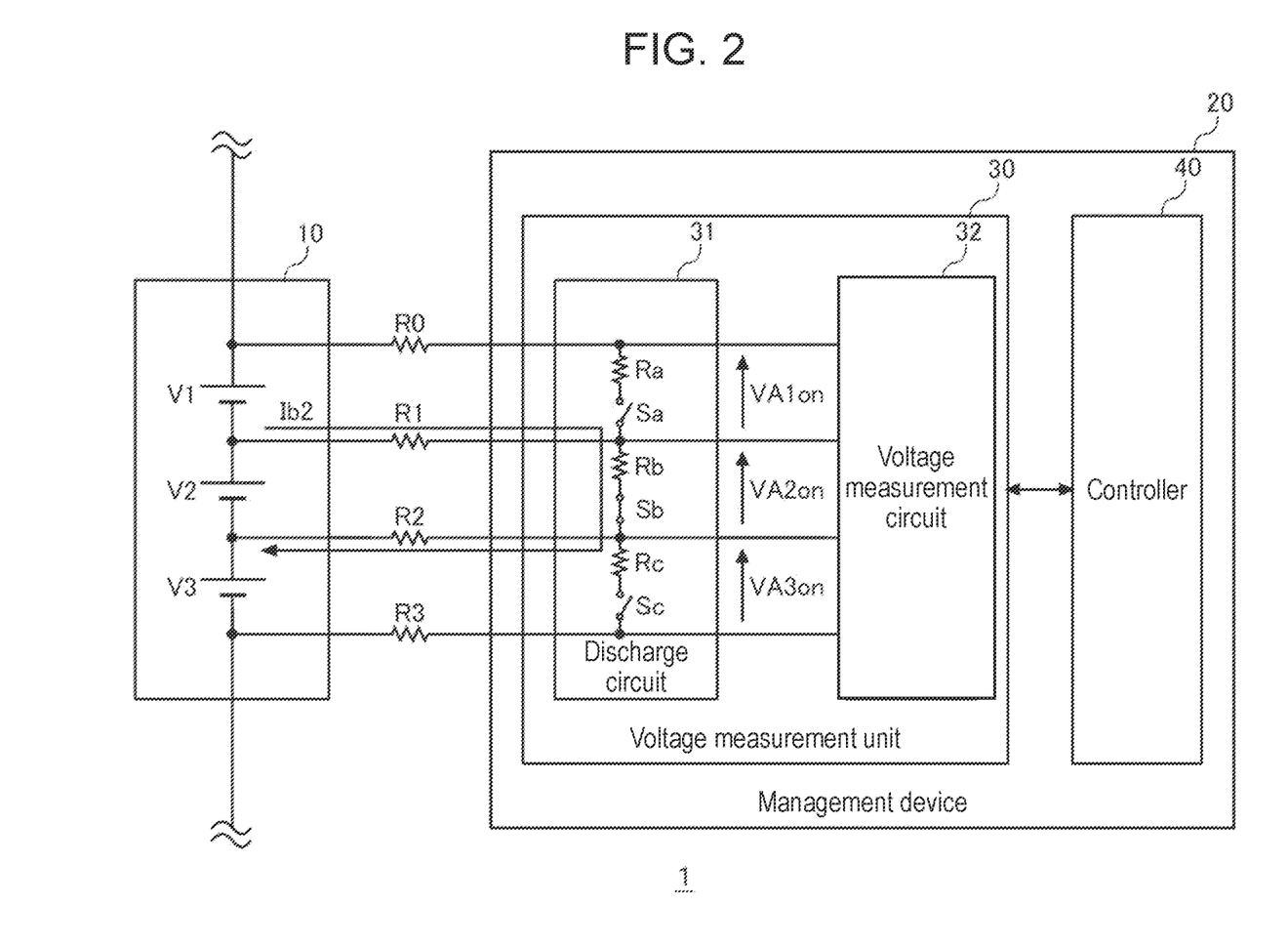
FIG. 2 is a diagram for explaining a first example of a method of acquiring a wiring resistance according to the present exemplary embodiment.

FIG. 2 is a diagram for explaining a first example of a method of acquiring the wiring resistance according to the present exemplary embodiment. The first example is a method of acquiring the wiring resistance of the external wiring connected to the cell at a center of power storage module 10. The example shown in FIG. 2 shows a method of acquiring wiring resistance R1 of the first external wiring and wiring resistance R2 of the second external wiring. The wiring resistance is measured during a period in which power storage module 10 and the load are electrically disconnected from each other and a current does not flow to the plurality of cells V1 to V3.

Controller 40 controls second discharge switch Sb to be in the ON state. Consequently, second equalization current Ib2 flows from the positive electrode of second cell V2 to the negative electrode of second cell V2 via the first external wiring, second discharge resistor Rb, second discharge switch Sb, and the second external wiring. Controller 40 calculates second equalization current Ib2 by the following (Equation 1).

$$Ib2 = VA2on/Rb \quad \text{(Equation 1)}$$

VA2on is the voltage of second cell V2 measured by voltage measurement circuit 32 when second discharge switch Sb is in the ON state.

Rb is the resistance value of second discharge resistor Rb. The resistance value of second discharge resistor Rb is a board-mounted component and is known. A more accurate value can be calculated by using Rb containing a wiring resistance component of the internal wiring in voltage measurement unit 30 and an ON resistance component of second discharge switch Sb. These resistance components can also be measured in advance.

Controller 40 acquires voltage VA1on of first cell V1 and voltage VA3on of third cell V3 measured by voltage measurement circuit 32 when second discharge switch Sb is in the ON state. Next, controller 40 turns off second discharge switch Sb, and acquires voltage VA1off of first cell V1 and voltage VA3off of third cell V3 measured by voltage measurement circuit 32 when second discharge switch Sb is tuned off. Controller 40 calculates voltage increase difference ΔVA1 due to first wiring resistance R1 by the following (Equation 2). Voltage increase difference ΔVA1 corresponds to a voltage drop value of an upper external wiring of a discharge circuit of second cell V2. Controller 40 calculates voltage increase difference ΔVA3 due to second wiring resistance R2 by the following (Equation 3). Voltage increase difference ΔVA3 corresponds to the voltage drop value of a lower external wiring of the discharge circuit of second cell V2.

$$\Delta VA1 = VA1on - VA1off \quad \text{(Equation 2)}$$

$$\Delta VA3 = VA3on - VA3off \quad \text{(Equation 3)}$$

As shown in the following (Equation 4), controller 40 calculates first wiring resistance R1 based on second equalizing current Ib2 obtained by the above (Equation 1) and voltage increase difference ΔVA1 obtained by the above (Equation 2). As shown in the following (Equation 5), controller 40 calculates second wiring resistance R2 based on second equalizing current Ib2 obtained by the above (Equation 1) and voltage increase difference ΔVA3 obtained by the above (Equation 3).

$$R1 = \Delta VA1/Ib2 \quad \text{(Equation 4)}$$

$$R2 = \Delta VA3/Ib2 \quad \text{(Equation 5)}$$

Controller 40 stores calculated first wiring resistance R1 and second wiring resistance R2 in internal nonvolatile memory 42.

Figure 3:
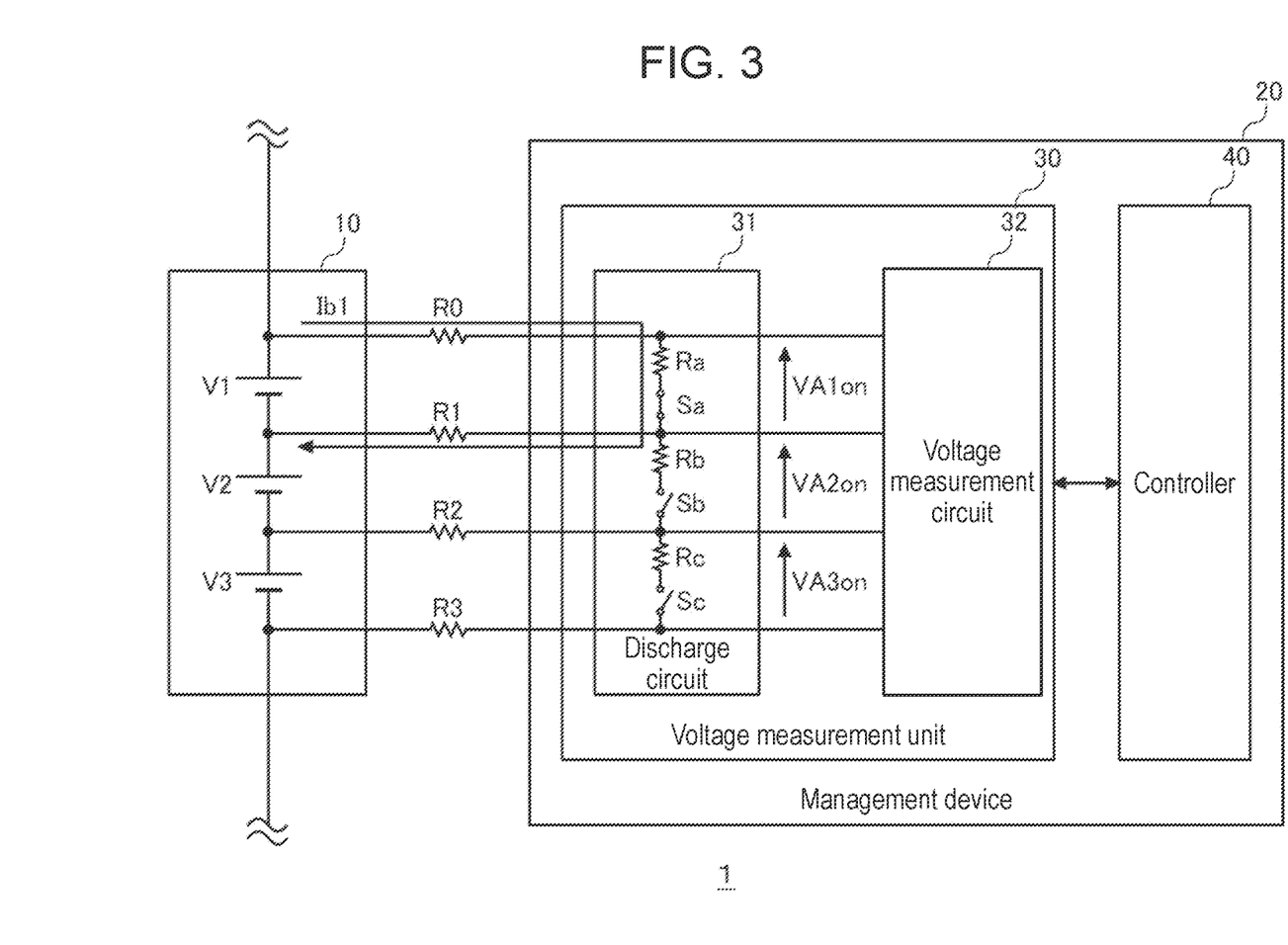
FIG. 3 is a diagram for explaining a second example of the method of acquiring the wiring resistance according to the present exemplary embodiment.

FIG. 3 is a diagram for explaining a second example of the method of acquiring the wiring resistance according to the present exemplary embodiment. The second example is a method of acquiring the wiring resistance of the external wiring connected to the cell at an end of power storage module 10. The example shown in FIG. 3 shows a method of acquiring wiring resistance R0 of the 0th external wiring.

Controller 40 controls first discharge switch Sa to be in the ON state. Consequently, first equalization current Ib1 flows from a positive electrode of first cell V1 to a negative electrode of first cell V1 via the 0th external wiring, first discharge resistor Ra, first discharge switch Sa, and the first external wiring. Controller 40 calculates first equalization current Ib1 by the following (Equation 6).

$$Ib1 = VA1on/Ra \quad \text{(Equation 6)}$$

VA1on is the voltage of first cell V1 measured by voltage measurement circuit 32 when first discharge switch Sa is in the ON state.

Ra is the resistance value of first discharge resistor Ra. The resistance value of first discharge resistor Ra is a board-mounted component and is known.

Controller 40 acquires voltage VA2on of second cell V2 measured by voltage measurement circuit 32 when first discharge switch Sa is in the ON state. Next, controller 40 turns off first discharge switch Sa, and acquires voltage VA2off of second cell V2 measured by voltage measurement circuit 32 when first discharge switch Sa is in the OFF state. Controller 40 calculates voltage increase difference ΔVA2 due to 0th wiring resistance R0 by the following (Equation 7). Voltage increase difference ΔVA2 corresponds to the voltage drop value of a lower external wiring of the discharge circuit of first cell V1.

$$\Delta VA2 = VA2on - VA2off \quad \text{(Equation 7)}$$

Controller 40 acquires voltage VA1 on of first cell V1 measured by voltage measurement circuit 32 when first discharge switch Sa is in the ON state. Next, controller 40 turns off first discharge switch Sa, and acquires voltage VA1off of first cell V1 measured by voltage measurement circuit 32 when first discharge switch Sa is in the OFF state. Controller 40 calculates voltage drop difference ΔVA1 due to both 0th wiring resistance R0 and first wiring resistance R1 by the following (Equation 8). Voltage drop difference ΔVA1 corresponds to a sum of the voltage drop values of the upper external wiring and the lower external wiring of the discharge circuit of first cell V1.

$$\Delta VA1 = VA1on - VA1off \quad \text{(Equation 8)}$$

As shown in the following (Equation 9), controller 40 calculates voltage increase difference ΔVA0 based on voltage increase difference ΔVA2 obtained by the above (Equation 7) and voltage drop difference ΔVA1 obtained by the above (Equation 8).

$$\Delta VA0 = -\Delta VA2 - \Delta VA1 \quad \text{(Equation 9)}$$

As shown in the following (Equation 10), controller 40 calculates 0th wiring resistance R0 based on first equalization current Ib1 obtained by the above (Equation 6) and voltage increase difference ΔVA0 obtained by the above (Equation 9). As shown in the following (Equation 11), controller 40 calculates first wiring resistance R1 based on first equalization current Ib1 obtained by the above (Equation 6) and voltage drop difference ΔVA1 obtained by the above (Equation 8).

$$R0 = \Delta VA0/Ib1 \quad \text{(Equation 10)}$$

$$R1 = \Delta VA1/Ib1 \quad \text{(Equation 11)}$$

Controller 40 stores calculated 0th wiring resistance R0 and first wiring resistance R1 in internal nonvolatile memory 42. When first wiring resistance R1 is already calculated by the above (Equation 4), the calculation of the above (Equation 11) can be omitted.

Controller 40 can calculate third wiring resistance R3 at a lower end by the same calculation method as that of 0th wiring resistance R0 at an upper end. Specifically, third wiring resistance R3 can be calculated by the following (Equation 12).

$$R3 = (-\Delta VA2 - \Delta VA3)/Ib3 \quad \text{(Equation 12)}$$

Figure 4:
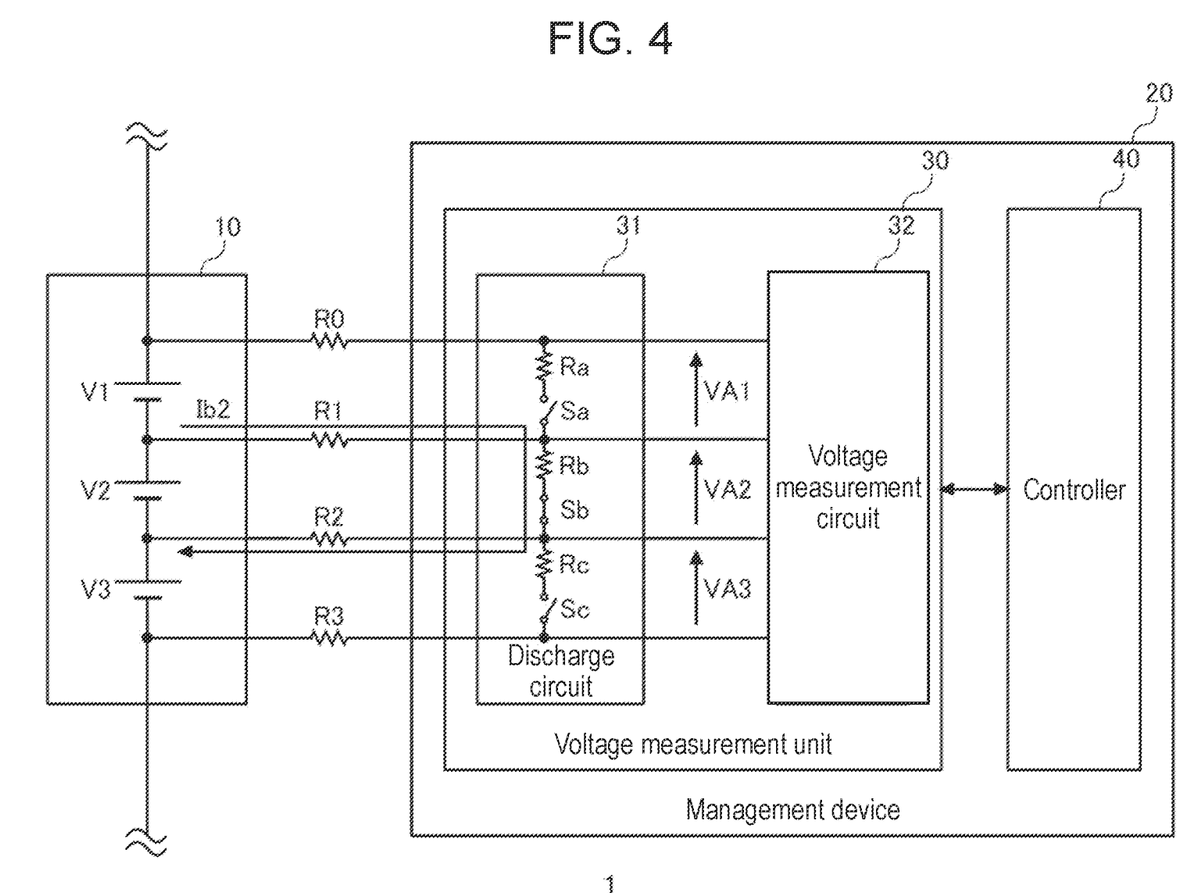
FIG. 4 is a diagram for explaining a first example of a method of correcting a cell voltage measured during an equalization process according to the present exemplary embodiment.

FIG. 4 is a diagram for explaining a first example of a method of correcting the cell voltage measured during the equalization process according to the present exemplary embodiment. In the example shown in FIG. 4, second discharge switch Sb is in the ON state, first discharge switch Sa and third discharge switch Sc are in the OFF state, second cell V2 is being subjected to equalization discharge, and upper adjacent first cell V1 and lower adjacent third cell V3 are in a state in which equalization discharge is not performed. Hereinafter, a method of correcting measured voltages of first cell V1 to third cell V3 in the state will be described.

As shown in the following (Equation 13), controller 40 calculates second equalization current Ib2 based on measured voltage VA2 of second cell V2 and the resistance value of second discharge resistor Rb.

$$Ib2 = VA2/Rb \quad \text{(Equation 13)}$$

As shown in the following (Equation 14), controller 40 calculates voltage variation value ΔVR1 due to the voltage drop of the first external wiring based on first wiring resistance R1 of the first external wiring acquired in advance and second equalization current Ib2 obtained by the above (Equation 13). As shown in the following (Equation 15), controller 40 calculates voltage variation value ΔVR2 due to the voltage drop of the second external wiring based on second wiring resistance R2 of the second external wiring acquired in advance and second equalization current Ib2 obtained by the above (Equation 13).

$$\Delta VR1 = R1 \times (-Ib2) \quad \text{(Equation 14)}$$

$$\Delta VR2 = R2 \times Ib2 \quad \text{(Equation 15)}$$

Here, for sign of the current value, a direction in which a current flows into the cell is set to plus, and a method in which a current flows out of the cell is set to minus. The current flowing through the first external wiring is a current in the direction in which the current flows out of the cell, and the sign of the current value is minus. On the other hand, the current flowing through the second external wiring is a current in the direction in which the current flows into the cell, and the sign of the current value is plus.

Controller 40 adds voltage variation value ΔVR1 (negative value) obtained by the above (Equation 14) to measured voltage VA1 of first cell V1 as shown in the following (Equation 16) to correct measured voltage VA1 of first cell V1. That is, measured voltage VA1 of first cell V1 is measured higher than the actual cell voltage by the voltage drop of the first external wiring, and voltage variation value ΔVR1 (negative value) is added to measured voltage VA1 of first cell V1, whereby the voltage drop of the first external wiring can be cancelled.

$$V1 = VA1 + \Delta VR1 \quad \text{(Equation 16)}$$

Controller 40 subtracts voltage variation value ΔVR1 (negative value) obtained by the above (Equation 14) from measured voltage VA2 of second cell V2 as shown in the following (Equation 17) and adds voltage variation value ΔVR2 (positive value) obtained by the above (Equation 15) to correct measured voltage VA2 of second cell V2. That is, measured voltage VA2 of second cell V2 is measured lower than the actual cell voltage by a sum of the voltage drop of the first external wiring and the voltage drop of the second external wiring. By subtracting voltage variation value ΔVR1 (negative value) of the first external wiring from measured voltage VA2 of second cell V2 and adding voltage variation value ΔVR2 (positive value) of the second external wiring, the voltage drop of the first external wiring and the second external wiring can be cancelled.

$$V2 = VA2 - \Delta VR1 + \Delta VR2 \quad \text{(Equation 17)}$$

Controller 40 subtracts voltage variation value ΔVR2 (positive value) obtained by the above (Equation 15) from measured voltage VA3 of third cell V3 as shown in the following (Equation 18) to correct measured voltage VA3 of third cell V3. That is, measured voltage VA3 of third cell V3 is measured higher than the actual cell voltage by the voltage drop of the third external wiring, and voltage variation value ΔVR2 (positive value) is added to measured voltage VA3 of third cell V3, whereby the voltage drop of the second external wiring can be cancelled.

$$V3 = VA3 - \Delta VR2 \quad \text{(Equation 18)}$$

Figure 5:
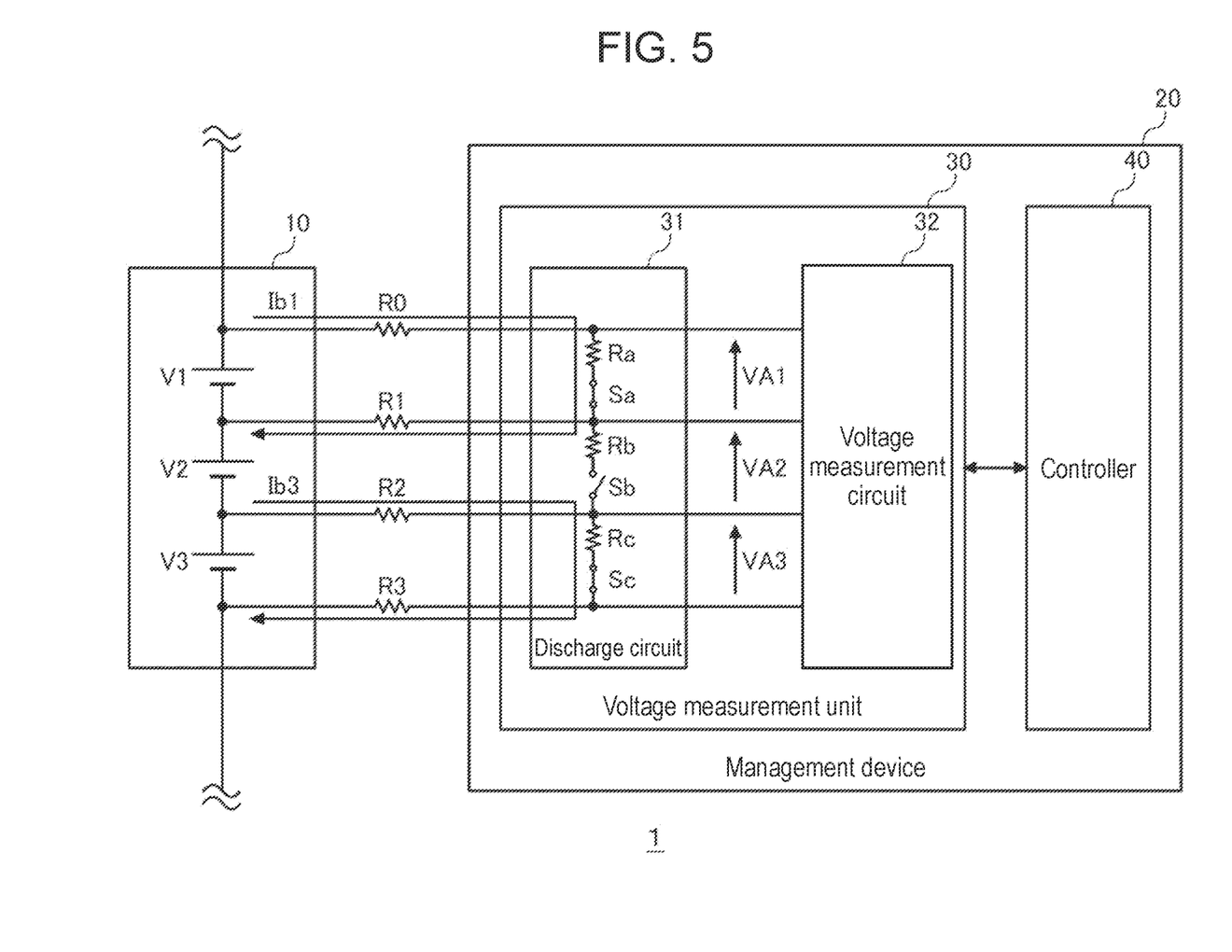
FIG. 5 is a diagram for explaining a second example of the method of correcting the cell voltage measured during the equalization process according to the present exemplary embodiment.

FIG. 5 is a diagram for explaining a second example of a method of correcting the cell voltage measured during the equalization process according to the present exemplary embodiment. In the example shown in FIG. 5, first discharge switch Sa and third discharge switch Sc are in the ON state, second discharge switch Sb is in the OFF state, first cell V1 and third cell V3 are being subjected to equalization discharge, and second cell V2 between first cell V1 and third cell V3 is in the state in which equalization discharge is not performed.

Hereinafter, a method of correcting measured voltages of first cell V1 to third cell V3 in the state will be described.

As shown in the following (Equation 19), controller 40 calculates first equalization current Ib1 based on measured voltage VA1 of first cell V1 and the resistance value of first discharge resistor Ra. As shown in the following (Equation 20), controller 40 calculates third equalization current Ib3 based on measured voltage VA3 of third cell V3 and the resistance value of third discharge resistor Rc.

$$Ib1 = VA1/Ra \quad \text{(Equation 19)}$$

$$Ib3 = VA3/Rc \quad \text{(Equation 20)}$$

As shown in the following (Equation 21), controller 40 calculates voltage variation value ΔVR0 due to the voltage drop of the 0th external wiring based on 0th wiring resistance R0 of the 0th external wiring acquired in advance and first equalization current Ib1 obtained by the above (Equation 19). As shown in the following (Equation 22), controller 40 calculates voltage variation value ΔVR1 due to the voltage drop of the first external wiring based on first wiring resistance R1 of the first external wiring acquired in advance and first equalization current Ib1 obtained by the above (Equation 19). As shown in the following (Equation 23), controller 40 calculates voltage variation value ΔVR2 due to the voltage drop of the second external wiring based on second wiring resistance R2 of the second external wiring acquired in advance and third equalization current Ib3 obtained by the above (Equation 20). As shown in the following (Equation 24), controller 40 calculates voltage variation value ΔVR3 due to the voltage drop of the third external wiring based on third wiring resistance R3 of the third external wiring acquired in advance and third equalization current Ib3 obtained by the above (Equation 20).

$$\Delta VR0 = R0 \times (-Ib1) \quad \text{(Equation 21)}$$

$$\Delta VR1 = R1 \times Ib1 \quad \text{(Equation 22)}$$

$$\Delta VR2 = R2 \times (-Ib3) \quad \text{(Equation 23)}$$

$$\Delta VR3 = R3 \times Ib3 \quad \text{(Equation 24)}$$

Here, for sign of the current value, the direction in which a current flows into the cell is set to plus, and the method in which a current flows out of the cell is set to minus. The current flowing through the 0th external wiring and the second external wiring is a current in the direction in which the current flows out of the cell, and the sign of the current value is minus. On the other hand, the current flowing through the first external wiring and the third external wiring is a current in the direction in which the current flows into the cell, and the sign of the current value is plus.

Controller 40 subtracts voltage variation value ΔVR0 (negative value) obtained by the above (Equation 21) from measured voltage VA1 of first cell V1 as shown in the following (Equation 25) and adds voltage variation value ΔVR1 (positive value) obtained by the above (Equation 22) to correct measured voltage VA1 of first cell V1. That is, measured voltage VA1 of first cell V1 is measured lower than the actual cell voltage by a sum of the voltage drop of the 0th external wiring and the voltage drop of the first external wiring. By subtracting voltage variation value ΔVR0 (negative value) of the 0th external wiring from measured voltage VA1 of first cell V1 and adding voltage variation value ΔVR1 (positive value) of the first external wiring to measured voltage VA1 of first cell V1, the voltage drop of the 0th external wiring and the first external wiring can be cancelled.

$$V1 = VA1 - \Delta VR0 + \Delta VR1 \quad \text{(Equation 25)}$$

As shown in the following (Equation 26), controller 40 subtracts voltage variation value ΔVR1 (positive value) obtained by the above (Equation 22) from measured voltage VA2 of second cell V2 and adds voltage variation value ΔVR2 (negative value) obtained by the above (Equation 23) to measured voltage VA2 of second cell V2, to correct measured voltage VA2 of second cell V2. That is, measured voltage VA2 of second cell V2 is measured higher than the actual cell voltage by a sum of the voltage drop of the first external wiring and the voltage drop of the second external wiring.

By subtracting voltage variation value ΔVR1 (positive value) of the first external wiring from measured voltage VA2 of second cell V2 and adding voltage variation value ΔVR2 (negative value) of the second external wiring to measured voltage VA2 of second cell V2, the voltage drop of the first external wiring and the second external wiring can be cancelled.

$$V2 = VA2 - \Delta VR1 + \Delta VR2 \quad \text{(Equation 26)}$$

As shown in the following (Equation 27), controller 40 subtracts voltage variation value ΔVR2 (negative value) obtained by the above (Equation 23) from measured voltage VA3 of third cell V3 and adds voltage variation value ΔVR3 (positive value) obtained by the above (Equation 24) to measured voltage VA3 of third cell V3, to correct measured voltage VA3 of third cell V3. That is, measured voltage VA3 of third cell V3 is measured lower than the actual cell voltage by a sum of the voltage drop of the second external wiring and the voltage drop of the third external wiring. By subtracting voltage variation value ΔVR2 (negative value) of the second external wiring from measured voltage VA3 of third cell V3 and adding voltage variation value ΔVR3 (positive value) of the third external wiring to measured voltage VA3 of third cell V3, the voltage drop of the second external wiring and the third external wiring can be cancelled.

$$V3 = VA3 - \Delta VR2 + \Delta VR3 \quad \text{(Equation 27)}$$

Figure 6:
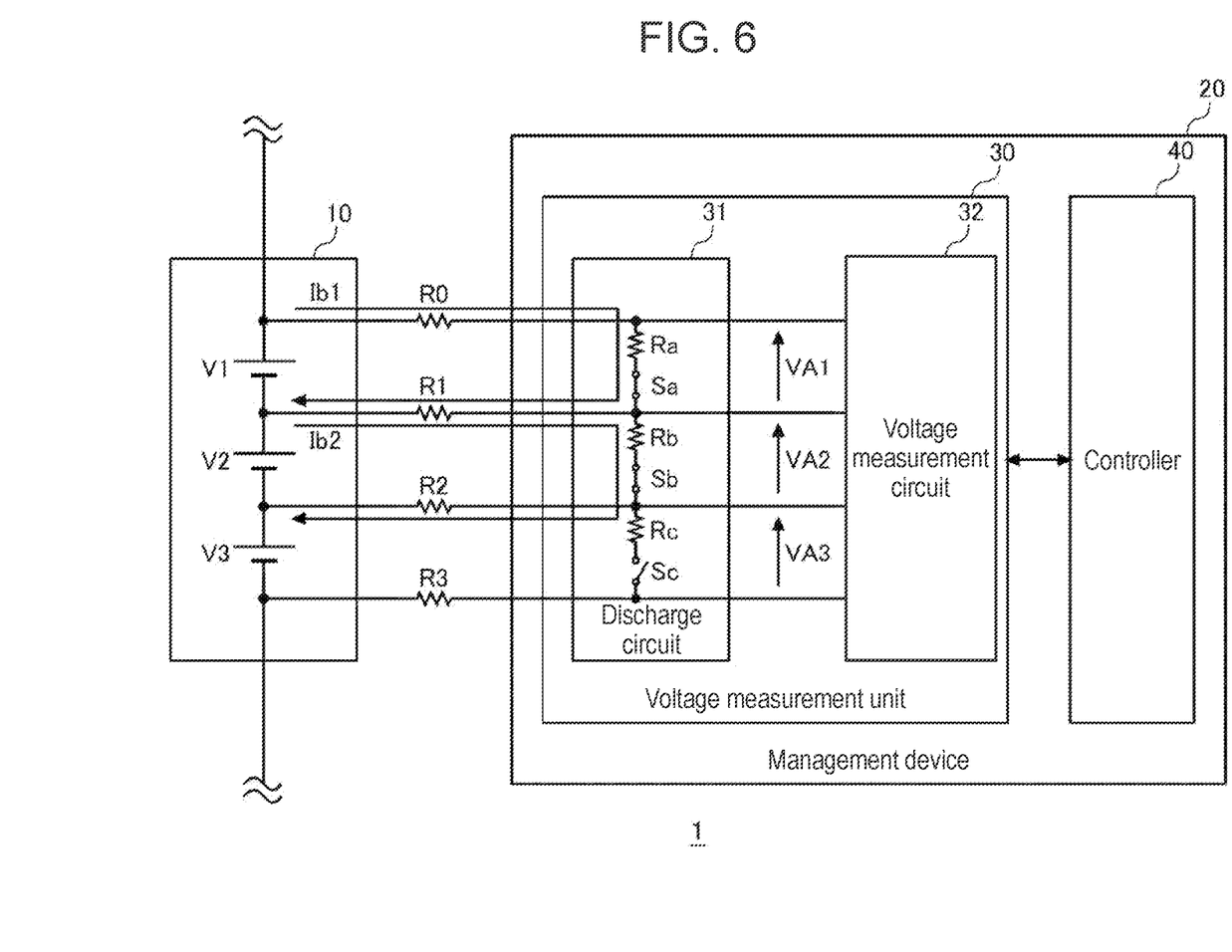
FIG. 6 is a diagram for explaining a third example of the method of correcting the cell voltage measured during the equalization process according to the present exemplary embodiment.

FIG. 6 is a diagram for explaining a third example of the method of correcting the cell voltage measured during the equalization process according to the present exemplary embodiment. In the example shown in FIG. 6, first discharge switch Sa and second discharge switch Sb are in the ON state, third discharge switch Sc is in the OFF state, first cell V1 and second cell V2 are being subjected to equalization discharge, and third cell V3 is in the state in which the equalizing discharge is not performed. Hereinafter, a method of correcting measured voltages of first cell V1 to third cell V3 in the state will be described.

As shown in the following (Equation 28), controller 40 calculates first equalization current Ib1 based on measured voltage VA1 of first cell V1 and the resistance value of first discharge resistor Ra. As shown in the following (Equation 29), controller 40 calculates second equalization current Ib2 based on measured voltage VA2 of second cell V2 and the resistance value of second discharge resistor Rb.

$$Ib1 = VA1/Ra \quad \text{(Equation 28)}$$

$$Ib2 = VA2/Rb \quad \text{(Equation 29)}$$

As shown in the following (Equation 30), controller 40 calculates voltage variation value ΔVR0 due to the voltage drop of the 0th external wiring based on 0th wiring resistance R0 of the 0th external wiring acquired in advance and first equalization current Ib1 obtained by the above (Equation 28). As shown in the following (Equation 31), controller 40 calculates voltage variation value ΔVR1 due to the voltage drop of the first external wiring based on first wiring resistance R1 of the first external wiring acquired in advance, first equalization current Ib1 obtained by the above (Equation 28), and second equalization current Ib2 obtained by the above (Equation 29). As shown in the following (Equation 32), controller 40 calculates voltage variation value ΔVR2 due to the voltage drop of the second external wiring based on second wiring resistance R2 of the second external wiring acquired in advance and second equalization current Ib3 obtained by the above (Equation 29).

$$\Delta VR0 = R0 \times (-Ib1) \quad \text{(Equation 30)}$$

$$\Delta VR1 = R1 \times (Ib1 - Ib2) \quad \text{(Equation 31)}$$

$$\Delta VR2 = R2 \times Ib2 \quad \text{(Equation 32)}$$

Here, a difference current between first equalization current Ib1 and second equalization current Ib2 flows through the first external wiring.

As shown in the following (Equation 33) controller 40 subtracts voltage variation value ΔVR0 (negative value) obtained by the above (Equation 30) from measured voltage VA1 of first cell V1 and adds voltage variation value ΔVR1 (positive or negative value) obtained by the above (Equation 31) to measured voltage VA1 of first cell V1, to correct measured voltage VA1 of first cell V1. That is, measured voltage VA1 of first cell V1 is measured lower than the actual cell voltage by a sum of the voltage drop of the 0th external wiring and the voltage drop of the first external wiring. By subtracting voltage variation value ΔVR0 (negative value) of the 0th external wiring from measured voltage VA1 of first cell V1 and adding voltage variation value ΔVR1 (positive or negative value) of the first external wiring to measured voltage VA1 of first cell V1, the voltage drop of the 0th external wiring and the first external wiring can be cancelled.

$$V1=VA1-\Delta VR0+\Delta VR1 \quad \text{(Equation 33)}$$

As shown in the following (Equation 34), controller 40 subtracts voltage variation value ΔVR1 (positive or negative value) obtained by the above (Equation 31) from measured voltage VA2 of second cell V2 and adds voltage variation value ΔVR2 (positive value) obtained by the above (Equation 32) to measured voltage VA2 of second cell V2, to correct measured voltage VA2 of second cell V2. That is, measured voltage VA2 of second cell V2 is measured lower than the actual cell voltage by a sum of the voltage drop of the first external wiring and the voltage drop of the second external wiring. By subtracting voltage variation value ΔVR1 (positive or negative value) of the first external wiring from measured voltage VA2 of second cell V2 and adding voltage variation value ΔVR2 (positive value) of the second external wiling to measured voltage VA2 of second cell V2, the voltage drop of the first external wiring and the second external wiring can be cancelled.

$$V2=VA2-\Delta VR1+\Delta VR2 \quad \text{(Equation 34)}$$

Controller 40 subtracts voltage variation value ΔVR2 (positive value) obtained by the above (Equation 32) from measured voltage VA3 of third cell V3 as shown in the following (Equation 35) to correct measured voltage VA3 of third cell V3. That is, measured voltage VA3 of third cell V3 is measured higher than the actual cell voltage by the voltage drop of the third external wiring, and voltage variation value ΔVR2 (positive value) is subtracted from measured voltage VA3 of third cell V3, whereby the voltage drop of the second external wiring can be cancelled.

$$V3=VA3-\Delta VR2 \quad \text{(Equation 35)}$$

By combining the patterns shown in the first to third examples described above, the measured voltage of each cell can be corrected with high accuracy regardless of the ON/OFF state of the plurality of discharge switches.

Figure 7:
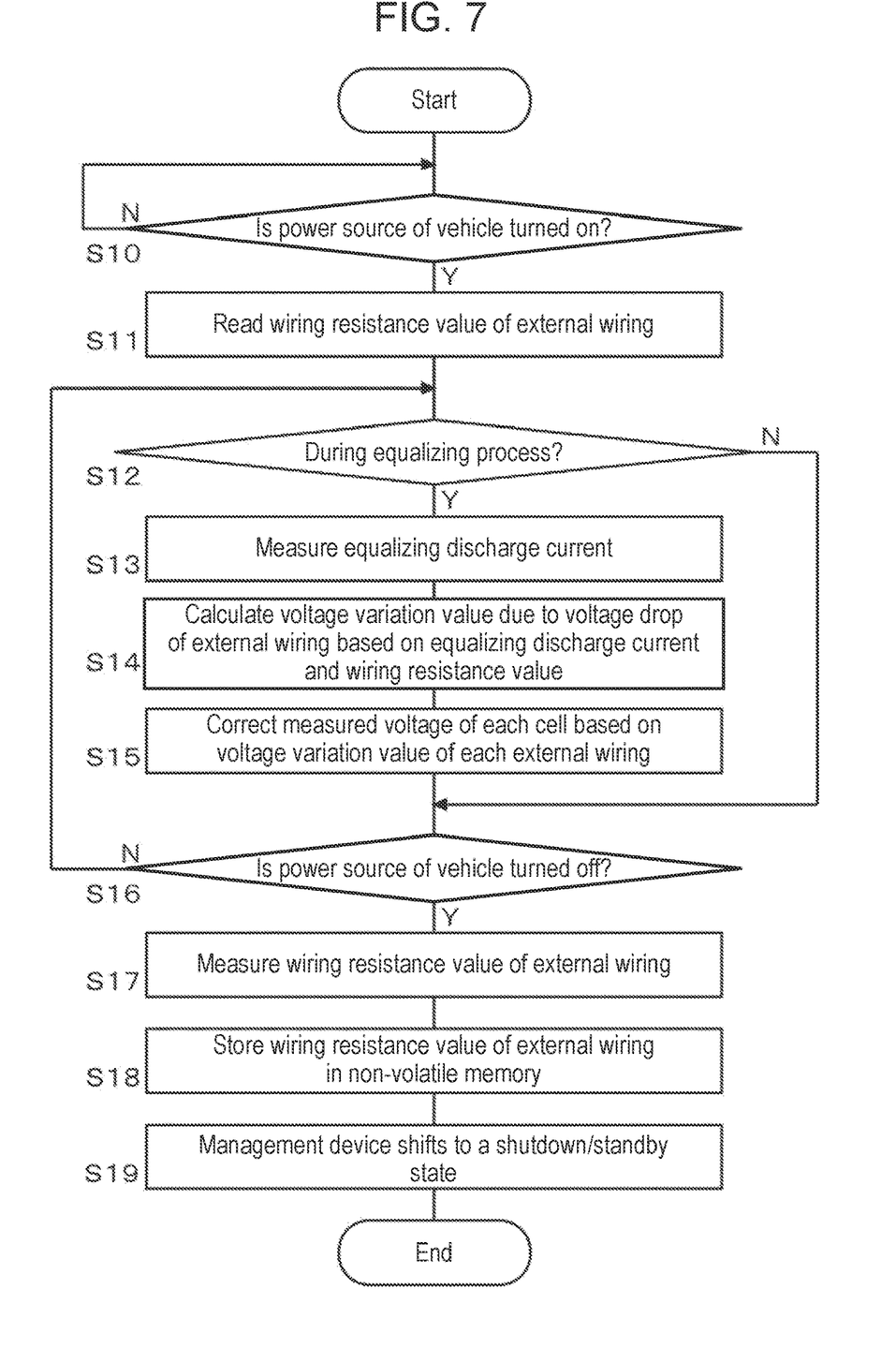
FIG. 7 is a flowchart for explaining an operation of a management device according to the exemplary embodiment of the present invention.

FIG. 7 is a flowchart for explaining an operation of management device 20 according to the exemplary embodiment of the present invention. When a driver turns on (corresponding to an ignition-on of an engine vehicle) a power source of an electric vehicle (Y in S10), management device 20 is activated. Controller 40 in management device 20 reads the wiring resistance values of the plurality of external wirings stored in nonvolatile memory 42 into a work area constructed in a volatile memory (not shown) (S11).

During the equalizing process (Y in S12), controller 40 measures an equalizing discharge current flowing in the discharge circuit connected in parallel to the cell being subjected to equalization discharge (S13). Controller 40 calculates the voltage variation value due to the voltage drop of each external wiring based on the measured equalizing discharge current and the wiring resistance value in the work area (S14). Controller 50 corrects the measured voltage of each cell based on the voltage variation value of each external wiring (S15). The above method shown in FIGS. 4 to 6 can be used for the processes in steps S13 to S15. When the equalizing process is not being performed in step S12 (N in S12), the processes in steps S13 to S15 is skipped.

When the driver turns off (corresponding to an ignition-off of an engine vehicle) the power source of the electric vehicle (Y in S16), controller 40 measures wiring resistance values of the plurality of external wirings (S17). The above method shown in FIGS. 2 to 3 can be used for the process in step S17. Controller 40 stores the measured wiring resistance value in nonvolatile memory 42 (S18). Management device 20 shifts to a shutdown/standby state (S19).

When the power source of the electric vehicle is in the ON state in step S16 (N in S16), the process proceeds to step S12, and the processes of step S12 and subsequent steps are continued.

As described above, according to the present exemplary embodiment, the wiring resistance of each external wiring is measured in advance, the current flowing through each external wiring during the equalizing process is measured, and the voltage drop value of each external wiring is calculated based on the wiring resistance value and the current value. The measured voltage of each cell is corrected based on the calculated voltage drop value of each external wiring. This can improve accuracy of the cell voltage measured during the equalizing process.

On the other hand, it is conceivable to measure in advance the correction voltage value for correcting the voltage drop value, instead of the wiling resistance value of the external wiring, and hold the correction voltage value. However, in that case, it is necessary to hold a plurality of the voltage correction values, corresponding to the ON/OFF state of the discharge switch, per cell. For example, in an equalizing circuit in which even/odd is constrained, four types of correction voltage values are required per cell. In this case, a program executed by microcomputer 41 becomes complicated.

In the case of using the correction voltage value measured in advance, if the cell voltage varies due to load variation of power storage module 10, correction accuracy of the cell voltage decreases. On the other hand, in the present exemplary embodiment, the current flowing through the external wiring during the equalizing process is measured, and the voltage drop value of the external wiring is calculated each time, so that an influence of the variation of the cell voltage due to the load variation of power storage module 10 can be eliminated.

The present invention has been described based upon the exemplary embodiment. The exemplary embodiment is intended to be illustrative only and it will be obvious to those skilled in the art that various modifications to constituting elements and processes could be developed and that such modifications are also within the scope of the present invention.

In the above exemplary embodiment, the example in which the above method of correcting the cell voltage is used in power storage system 1 for in-vehicle use has been described. However, also in power storage system 1 for stationary power storage applications, the above method of correcting the cell voltage can be used. The above method of correcting the cell voltage can also be used in power storage system 1 for electronic devices such as notebook PCs and smartphones.

In above FIG. 7, there has been described the example in which the wiring resistance value of the external wiring is measured every time the power source of the electric vehicle is turned off. In this respect, when management device 20 can be activated at high speed, the measurement may be performed every time the power source of the electric vehicle is turned on. For applications other than in-vehicle use, it is easy to adopt a method of measuring the wiring resistance value at a timing when power storage system 1 is activated.

A measurement frequency of the wiring resistance value of the external wiring may be set for a longer period. For example, the wiring resistance value may be measured every few days or every week.

Note that the exemplary embodiment may be defined by the following items.

[Item 1]

Management device (20) includes voltage measurement circuit (32) that is connected to m (m is an integer of more than or equal to 2) cells (V1 to V3), connected in series, by (m+1) wirings and measures each voltage of the m cells (V1 to V3), m discharge circuits (31) that are each connected between two adjacent wirings of the (m+1) wirings and each include discharge resistor (Ra to Rc) and switch (Sa to Sc) connected in series, and controller (40) that executes an equalizing process of the m cells (V1 to V3) by controlling each of the switches (Sa to Sc) of m discharge circuits (31) based on the voltages of the m cells (V1 to V3) measured by voltage measurement circuit (32).

In this management device, during execution of the equalizing process among the plurality of cells, controller (40) measures a value of a current, flowing from a positive electrode of an nth (1≤n≤m) cell to a negative electrode of the nth cell through an nth discharge resistor, based on a resistance value of the nth discharge resistor connected to an nth switch in an ON state and a voltage value of the nth cell measured by voltage measurement circuit (32) and calculates an (n−1)th voltage drop value due to a wiring resistance value of an (n−1)th wiring and an nth voltage drop value due to a wiring resistance value of an nth wiring based on the measured current value and the wiring resistance value of the (n−1)th wiring connected to the positive electrode of the nth cell and a wiring resistance value of the nth wiring connected to the negative electrode of the nth cell, the wiring resistance value of the (n−1)th wiring and the wiring resistance value of the nth wiring being measured in advance, and based on the (n−1)th voltage drop value and the nth voltage drop value, corrects the voltage value of the nth cell, a voltage value of an (n−1)th cell, and a voltage value of an (n+1)th cell measured by voltage measurement circuit (32).

This can improve accuracy of the voltages of cells (V1 to V3) measured during the equalizing process.

[Item 2]

In management device (20) according to item 1, controller (40) controls an nth switch to be in the ON state during a period in which m cells (V1 to V3) connected in series are not charged and discharged, measures an nth current value flowing from the positive electrode of the nth cell to the negative electrode of the nth cell through the nth discharge resistor based on the resistance value of the nth discharge resistor and the voltage value of the nth cell measured by voltage measurement circuit (32), calculates an (n−1)th difference voltage between the voltage value of the (n−1)th cell measured by voltage measurement circuit (32) when the nth switch is in the ON state and the voltage value of the (n−1)th cell measured by voltage measurement circuit (32) when the nth switch is in an OFF state, calculates an (n+1)th difference voltage between the voltage value of the (n+1)th cell measured by voltage measurement circuit (32) when the nth switch is in the ON state and the voltage value of the (n+1)th cell measured by voltage measurement circuit (32) when the nth switch is in the OFF state, calculates the wiring resistance value of the nth wiring based on the nth current value and the (n−1)th difference voltage, and calculates a wiring resistance value of an (n+1)th wiring based on the nth current value and the (n+1)th difference voltage.

According to this, the wiring resistance value of the wiring connected to the cell at a center of the plurality of cells (V1 to V3) can be estimated with high accuracy.

[Item 3]

In management device (20) according to item 1 or 2, controller (40) controls a first switch to be in the ON state during a period in which m cells (V1 to V3) connected in series are not charged and discharged, measures a first current value flowing from a positive electrode of a first cell to a negative electrode of the first cell through a first discharge resistor based on a resistance value of the first discharge resistor and a voltage value of the first cell measured by voltage measurement circuit (32), calculates a second difference voltage between a voltage value of a second cell measured by voltage measurement circuit (32) when the first switch is in the ON state and a voltage value of the second cell measured by voltage measurement circuit (32) when the first switch is in the OFF state, calculates a first difference voltage between the voltage value of the first cell measured by voltage measurement circuit (32) when the first switch is in the ON state and the voltage value of the first cell measured by voltage measurement circuit (32) when the first switch is in the OFF state, and calculates a wiring resistance value of a 0th wiring based on the first current value, the second difference voltage, and the first difference voltage.

Controller (40) controls an mth switch to be in the ON state during the period in which m cells (V1 to V3) connected in series are not charged and discharged, measures an mth current value flowing from a positive electrode of the mth cell to a negative electrode of the mth cell through an mth discharge resistor based on a resistance value of the mth discharge resistor and a voltage value of the mth cell measured by voltage measurement circuit (32), calculates an (m−1)th difference voltage between a voltage value of an (m−1)th cell measured by voltage measurement circuit (32) when the mth switch is in the ON state and a voltage value of an (m−1)th cell measured by voltage measurement circuit (32) when the mth switch is in the OFF state, calculates an mth difference voltage between the voltage value of the mth cell measured by voltage measurement circuit (32) when the mth switch is in the ON state and the voltage value of the mth cell measured by voltage measurement circuit (32) when the mth switch is in the OFF state, and calculates a wiring resistance value of the mth wiring based on the mth current value, the (m−1)th difference voltage, and the mth difference voltage.

According to this, the wiring resistance value of the wiring connected to the cell at an end of the plurality of cells (V1 to V3) can be estimated with high accuracy.

[Item 4]

Power storage system (1) includes a plurality of cells (V1 to V3) connected in series and management device (20) according to any one of items 1 to 3, that manages the plurality of cells.

This can construct power storage system (1) in which accuracy of the voltages of cells (V1 to V3) measured during the equalizing process is improved.

[Item 5]

In power storage system (1) according to item 4, power storage system (1) is mounted on an electric vehicle, and when a power source of the electric vehicle is turned off, controller (40) measures each wiring resistance value of the (m+1) wirings, stores each of the measured wiring resistance values in a nonvolatile memory, and then terminates operation.

According to this, it is possible to maintain the highly accurate wiring resistance value without increasing the load at the time of starting power storage system 1.

REFERENCE MARKS IN THE DRAWINGS 1 power storage system
10 power storage module
V1-V3 cell
F0-F3 fuse
CN1 first connector
H0-H3 wire harness
R0-R4 wiring resistance
Rw0-Rw3 harness resistance
Ra-Rc discharge resistor
Sa-Sc discharge switch
20 management device
CN2 second connector
30 voltage measurement unit
31 discharge circuit
32 voltage measurement circuit
40 controller
41 microcomputer
42 nonvolatile memory

The invention claimed is:

1. A management device comprising:
a voltage measurement circuit that is connected by (m+1) wirings to m cells connected in series, and measures voltages of the m cells, where m is an integer of more than or equal to 2;
m discharge circuits that are each connected between a respective one of adjacent pair of the (m+1) wirings, and each include a discharge resistor and a switch connected in series; and
a controller that executes an equalizing process among the m cells by controlling the switches of the m discharge circuits based on the voltages of the m cells measured by the voltage measurement circuit, wherein,
during execution of the equalizing process among the plurality of cells, the controller
measures a current value flowing from a positive electrode of an nth cell to a negative electrode of the nth cell through an nth discharge resistor connected to an nth switch in an ON state, based on a resistance value of the nth discharge resistor and a voltage value of the nth cell measured by the voltage measurement circuit, where n satisfies 1≤n≤m,
calculates (i) an (n−1)th voltage drop value resulting from a wiring resistance value of an (n−1)th wiring connected to the positive electrode of the nth cell and (ii) an nth voltage drop value resulting from a wiring resistance value of an nth wiring connected to the negative electrode of the nth cell, based on (a) the measured current value (b) the wiring resistance value of the (n−1)th wiring, and (c) the wiring resistance value of the nth wiring, the wiring resistance value of the (n−1)th wiring and the wiring resistance value of the nth wiring being measured in advance, and
based on the (n−1)th voltage drop value and the nth voltage drop value, corrects the voltage value of the nth cell, a voltage value of an (n−1)th cell, and a voltage value of an (n+1)th cell measured by the voltage measurement circuit,
wherein the controller controls a first switch to be in the ON state during a period in which the m cells connected in series are not charged and discharged,
measures a first current value flowing from a positive electrode of a first cell to a negative electrode of the first cell through a first discharge resistor based on a resistance value of the first discharge resistor and a voltage value of the first cell measured by the voltage measurement circuit,
calculates a second difference voltage between a voltage value of a second cell measured by the voltage measurement circuit when the first switch is in the ON state and a voltage value of the second cell measured by the voltage measurement circuit when the first switch is in the OFF state,
calculates a first difference voltage between the voltage value of the first cell measured by the voltage measurement circuit when the first switch is in the ON state and the voltage value of the first cell measured by the voltage measurement circuit when the first switch is in the OFF state,
calculates a wiring resistance value of a 0th wiring based on the first current value, the second difference voltage, and the first difference voltage,
and the controller controls an mth switch to be in the ON state during the period in which the m cells connected in series are not charged and discharged,
measures an mth current value flowing from a positive electrode of the mth cell to a negative electrode of the mth cell through an mth discharge resistor based on a resistance value of the mth discharge resistor and a voltage value of the mth cell measured by the voltage measurement circuit,
calculates an (m−1)th difference voltage between a voltage value of an (m−1)th cell measured by the voltage measurement circuit when the mth switch is in the ON state and a voltage value of an (m−1)th cell measured by the voltage measurement circuit when the mth switch is in the OFF state,
calculates an mth difference voltage between the voltage value of the mth cell measured by the voltage measurement circuit when the mth switch is in the ON state and the voltage value of the mth cell measured by the voltage measurement circuit when the mth switch is in the OFF state, and calculates a wiring resistance value of the mth wiring based on the mth current value, the (m−1)th difference voltage, and the mth difference voltage.

2. The management device according to claim 1, wherein the controller controls an nth switch to be in the ON state during a period in which the m cells connected in series are not charged and discharged,
- measures an nth current value flowing from the positive electrode of the nth cell to the negative electrode of the nth cell through the nth discharge resistor based on the resistance value of the nth discharge resistor and the voltage value of the nth cell measured by the voltage measurement circuit,
- calculates an (n−1)th difference voltage between the voltage value of the (n−1)th cell measured by the voltage measurement circuit when the nth switch is in the ON state and the voltage value of the (n−1)th cell measured by the voltage measurement circuit when the nth switch is in an OFF state,
- calculates an (n+1)th difference voltage between the voltage value of the (n+1)th cell measured by the voltage measurement circuit when the nth switch is in the ON state and the voltage value of the (n+1)th cell measured by the voltage measurement circuit when the nth switch is in the OFF state,
- calculates the wiring resistance value of the nth wiring based on the nth current value and the (n−1)th difference voltage, and
- calculates a wiring resistance value of an (n+1)th wiring based on the nth current value and the (n+1)th difference voltage.

3. A power storage system comprising:
a plurality of cells connected in series; and
the management device according to claim 1, that manages the plurality of cells.

4. The power storage system according to claim 3, wherein the power storage system is mounted on an electric vehicle, and when a power source of the electric vehicle is turned off, the controller measures each wiring resistance value of the (m+1) wirings, stores the each wiring resistance value in a nonvolatile memory, and then terminates operation.

* * * * *